United States Patent
Matsunaga et al.

[11] Patent Number: 6,079,987
[45] Date of Patent: Jun. 27, 2000

[54] CONNECTOR FOR ELECTRONIC PARTS

[75] Inventors: Hitoshi Matsunaga; Yukie Hayashi, both of Tokyo, Japan

[73] Assignee: Unitechno, Inc., Tokyo, Japan

[21] Appl. No.: 09/206,424

[22] Filed: Dec. 7, 1998

[30] Foreign Application Priority Data

Dec. 26, 1997 [JP] Japan .................................. 9-359887

[51] Int. Cl.$^7$ .................................................. H01R 4/58
[52] U.S. Cl. .............................................................. 439/66
[58] Field of Search ................................ 439/66, 91, 591

[56] References Cited

U.S. PATENT DOCUMENTS

| | | | |
|---|---|---|---|
| 4,998,885 | 3/1991 | Beaman | 439/66 |
| 5,071,359 | 12/1991 | Arnio | 439/91 |
| 5,427,535 | 6/1995 | Sinclair | 439/66 |
| 5,938,451 | 8/1999 | Rathburn | 439/66 |
| 5,984,691 | 11/1999 | Brodsky et al. | 439/91 |

*Primary Examiner*—Neil Abrams
*Attorney, Agent, or Firm*—Ratner & Prestia

[57] ABSTRACT

Herein disclosed a connector for electrically connecting an integrated circuit having a plurality of IC terminals with an electronic circuit having a plurality of electronic pads each corresponding to each of the IC terminals of the integrated circuit.

The connector comprises an insulating elastic sheet having first and second surfaces and formed with a plurality of through bores at the positions corresponding to the IC terminals of the integrated circuit and a plurality of conductive portions to be respectively received in the through bores of the insulating elastic sheet. Each of the conductive portions comprises first and second conductive pressing plates respectively disposed on the first and second surfaces of the insulating elastic sheet to cover each of the through bores of the insulating elastic sheet; a lead member positioned in each of the through bores of the insulating elastic sheet to have its both ends respectively connected with the first and second conductive pressing plates; and first and second conductive terminals having their one ends connected to the first and second conductive pressing plates to have their other ends face to each of the IC terminals of the integrated circuit and the electronic pads of the electronic circuit, respectively. The lead member of each of the conductive portions is formed with a twisted bundle of a plurality of fine leads each being fine enough to bend in accordance with the elastic movement of the insulating elastic sheet and to cause rotation of the conductive terminal.

10 Claims, 4 Drawing Sheets

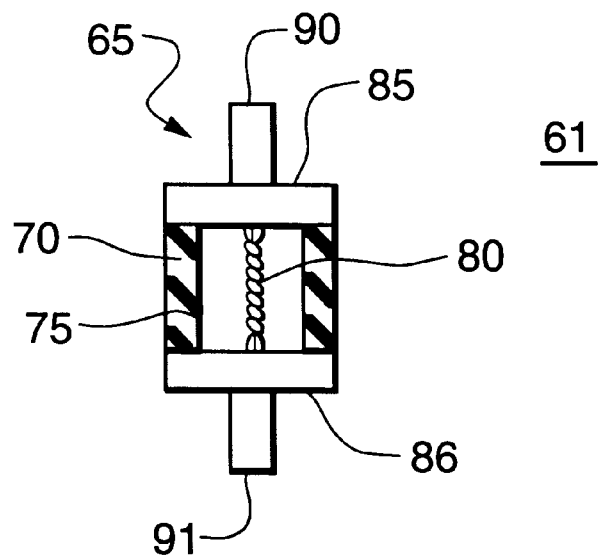
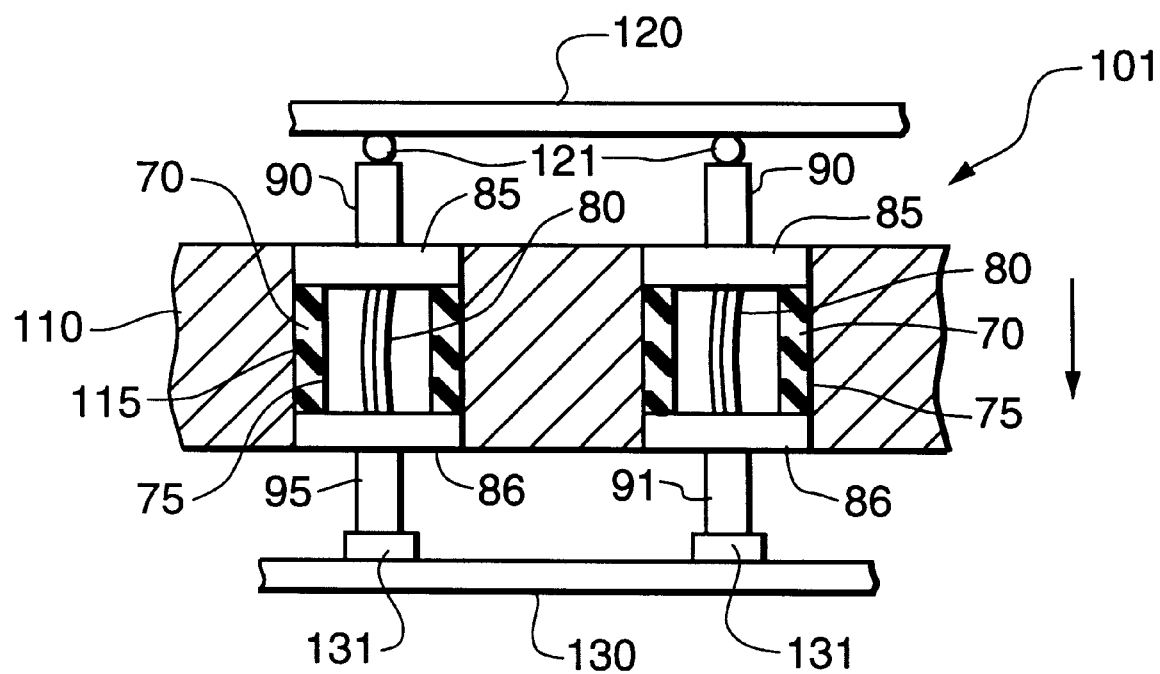

CONNECTOR FOR ELECTRONIC PARTS

FIELD OF THE INVENTION

The present invention relates to a connector for electrically connecting electronic parts, such as an integrated circuit and an electronic circuit, to be utilized for testing the electronic parts, and more particularly to a connector to be utilized for testing high frequency electronic parts.

BACKGROUND OF THE INVENTION

Generally, an integrated circuit comprising a plurality of IC terminals is tested its electronic performances before it is put on the market. In order to test the integrated circuit, the integrated circuit is electrically connected to an electronic circuit comprising a plurality of electronic pads corresponding to the IC terminals of the integrated circuit.

There have been provided a various forms of integrated circuits, such as ball grid array form or fine-pitch ball grid array form. The IC terminals of such the integrated circuit are formed with solder bumps and arrayed at one side of the integrated circuit. Because of the fact that the IC terminals of the integrated circuits are formed with solder bumps, there may be difference in heights among the IC terminals of the integrated circuit. This may cause the problem that some of the IC terminals of the integrated circuit cannot be connected with the corresponding electronic pads of the electronic circuit when the integrated circuit is put on the electronic circuit to have each of the IC terminals face each of the electronic pads. In order to solve the problem, a connector such as an IC socket is used to connect the integrated circuit and the electronic circuit.

There is shown in FIGS. 5 and 6 a first example of a conventional IC socket 190 to connect an integrated circuit 170 and the electronic circuit 180. The integrated circuit 170 has a plurality of IC terminals 171 while the electronic circuit 180 has a plurality of electronic pads 181 each corresponding to the IC terminals 171 of the integrated circuit 170.

As shown in FIG. 5, the IC socket 190 comprises a support portion 191 and a plurality of probe pins 193 each having electrically conductive first and second terminals 194 and 195 at its longitudinal ends. The support portion 191 of the IC socket 190 is formed with a plurality of through bores 192 to have each of the probe pins 193 respectively received therein.

The IC socket 190 is positioned between the integrated circuit 170 and the electronic circuit 180 to electrically connect the integrated circuit 170 and the electronic circuit 180. Then, the integrated circuit 170 is urged toward the electronic circuit 180 by urging means (not shown in the drawings), to ensure the connections between the integrated circuit 170, IC socket 190 and the electronic circuit 180.

FIG. 6 shows one of the probe pins 193 in detail. The probe pin 193 comprises its inside a coil spring 196 having first and second contact balls 197 and 198 at its both ends to be respectively held in contact with the first and second terminals 194 and 195 of the probe pin 193. The first and second terminals 194 and 195 of the probe pins 193 are to be respectively held in contact with the IC terminals 171 of the integrated circuit 170 and the electronic pads 181 of the electronic circuit 180.

The IC socket 190 can accommodate and withstand the force generated by the urging means which is urging the integrated circuit 170 toward the electronic circuit 180, because of the fact that each of the probe pins 193 of the IC socket 190 has the coil spring 196.

The conventional IC socket 190, however, cannot be conform to a recently designed high frequency integrated circuit having extremely short cycle pitch, with an electronic circuit for testing the integrated circuit.

As shown in FIG. 6, the IC socket 190 is positioned between the integrated circuit 170 and the electronic circuit 180 to electrically connect the integrated circuit 170 and the electronic circuit 180 and to allow the electronic current to flow in the coil spring 196 of the probe pin 193. As is understood from the drawing, the distance between the integrated circuit 170 and the electronic circuit 180 by way of the coil spring 196 through which the current flows is much longer than the distance in straight line between the integrated circuit 170 and the electronic circuit 180. This difference in distance can cause errors on the results of the test especially when the electronic performances of the high frequency integrated circuit are tested.

Furthermore, as coils are known to generate electromagnetic induction, the coil spring 196 as being a coil may cause an undesirable effect on the results of the test.

Another example of a conventional IC socket 260 to connect an IC 240 and an electronic circuit 250 is shown in FIGS. 7 and 8.

The IC socket 260 comprises a support portion 263 having a certain thickness and being formed with upper and lower surfaces each extending parallel relationship with each other, and a plurality of first and second terminals 261 and 262.

FIG. 8 shows a part of the IC socket 260 in detail. The support portion 263 is formed with an insulating rubber 265 such as a silicon rubber and a plurality of electrically conductive wires 264 each being fitted in the insulating rubber 265 with inclined relationship to the upper and lower surfaces of the support portion 263 to be spaced apart from each other at a predetermined small pitch.

The first and second terminals 261 and 262 are respectively disposed at the upper and lower surfaces of the insulating rubber 265 to be correspondingly connected by some of the electrically conductive wires 264. Because of the fact that the electrically conductive wires 264 are spaced apart from each other at the predetermined small pitch, each of the first and second terminals 261 and 262 of the IC socket 260 is insulating from the adjacent first and second terminals 261 and 262, respectively.

As shown in FIG. 8, the IC socket 260 is positioned between an integrated circuit 240 and an electronic circuit 250 to electrically connect the integrated circuit 240 and the electronic circuit 250. Then, the integrated circuit 240 is urged toward the electronic circuit 250 by urging means (not shown in the drawings), to ensure the connections between the integrated circuit 240, IC socket 260 and the electronic circuit 250.

The IC socket 260 can accommodate and withstand the force generated by the urging means which is urging the integrated circuit 240 toward the electronic circuit 250, because of the fact that each of the electrically conductive wires 264 is fitted in the insulating rubber 265 with inclined relationship to the upper and lower surfaces of the support portion 263.

The conventional IC socket 260, however, cannot be conform to a recently designed high frequency integrated circuit having a lot of IC terminals in a small space, with an electronic circuit for testing the integrated circuit. The IC socket needs to have a lot of terminals in a small space in order to connect such the recently designed high frequency integrated circuit with an electronic circuit.

Because of the fact that the electrically conductive wires 264 are fitted in the insulating rubber 265 with inclined relationship to the upper and lower surfaces of the support portion 263, as shown in FIG. 8, the first and second terminals 261 and 262 are respectively positioned at upper and lower surfaces of the support portion 263 with inclined relationship with each other to have some of the electrically conductive wires 264 put therebetween. Therefore, it is difficult for the IC socket 260 to have a lot of terminals in a small space.

Furthermore, as is understood from FIG. 8, the length D2 of each of the electrically conductive wires 264 through which the current of electricity is allowed to flow is longer than the thickness D1 of the support portion 263. This difference in distance can cause errors on the results of the test especially when the electronic performances of the high frequency integrated circuit having extremely short cycle pitch, are tested.

SUMMARY OF THE INVENTION

It is therefore an object of the present invention to provide a connector, such as an IC socket, which can be conform to a recently designed high frequency integrated circuit having extremely short cycle pitch, with an electronic circuit for testing the integrated circuit.

It is a further object of the present invention to provide a connector, such as an IC socket, having a lot of terminals in a small space to connect a recently designed high frequency integrated circuit having a lot of terminals in a small space, with an electronic circuit for testing the integrated circuit.

According to a first aspect of the present invention there is provided a connector for electrically connecting a pair of electronic parts each having a terminal, the terminals of the pair of electronic parts correspondingly positioned to each other. The connector comprises: an insulating elastic sheet having a predetermined thickness and first and second surfaces extending parallel relationship with each other and formed with a through bore having an axis extending perpendicular relationship to each of the first and second surfaces at a position corresponding to the terminals of the pair of electronic parts; first and second conductive pressing plates respectively disposed on the first and second surfaces of the insulating elastic sheet to cover the through bore of the insulating elastic sheet; a lead member positioned in the through bore of the insulating elastic sheet to have its both ends respectively connected with the first and second conductive pressing plates; and first and second conductive terminals having their one ends connected to the first and second conductive pressing plates to have their other ends face to the terminals of the pair of electronic parts, respectively. The lead member is formed with a fine lead fine enough to bend in accordance with the elastic movement of the insulating elastic sheet.

The connector may be utilized for connecting an integrated circuit with an electronic circuit for testing the integrated circuit.

According to the second aspect of the present invention, there is provided a connector for electrically connecting a pair of electronic parts each having a terminal, the terminals of the pair of electronic parts correspondingly positioned to each other. The connector comprises: an insulating elastic sheet having a predetermined thickness and first and second surfaces extending parallel relationship with each other and formed with a through bore having an axis extending perpendicular relationship to each of the first and second surfaces at a position corresponding to the terminals of the pair of electronic parts; first and second conductive pressing plates respectively disposed on the first and second surfaces of the insulating elastic sheet to cover the through bore of the insulating elastic sheet; a lead member positioned in the through bore of the insulating elastic sheet to have its both ends respectively connected with the first and second conductive pressing plates; and first and second conductive terminals having their one ends connected to the first and second conductive pressing plates to have their other ends face to the terminals of the pair of electronic parts, respectively. The lead member is formed with a bundle of a plurality of fine leads each being fine enough to bend in accordance with the elastic movement of the insulating elastic sheet.

The connector may be utilized for connecting an integrated circuit with an electronic circuit for testing the integrated circuit.

The bundle of the plurality of fine leads forming the lead member may be twisted.

According to the third aspect of the present invention, there is provided a connector for electrically connecting a pair of electronic parts each having a plurality of terminals, the terminals of the pair of electronic parts correspondingly positioned to each other. The connector comprises: an insulating elastic sheet having a predetermined thickness and first and second surfaces extending parallel relationship with each other and formed with a plurality of through bores each having an axis extending perpendicular relationship to each of the first and second surfaces at positions corresponding to the plurality of terminals of the pair of electronic parts; and a plurality of connecting portions each comprising: an insulating elastic block having a predetermined thickness and first and second surfaces extending parallel relationship with each other and formed with a through bore having an axis extending perpendicular relationship with each of the first and second surfaces; first and second conductive pressing plates respectively disposed on the first and second surfaces of the insulating elastic block to cover the through bore of the insulating elastic block; a lead member positioned in the through bore of the insulating elastic block to have its both ends respectively connected with the first and second conductive pressing plates, the lead member being formed with a fine lead fine enough to bend in accordance with the elastic movement of the insulating elastic sheet; and first and second conductive terminals having their one ends connected to the first and second conductive pressing plates, respectively. Each of the plurality of connecting portions is embedded in each of the through bores of the insulating elastic sheet to have the other ends of the first and second conductive pressing plates of each of the connecting portion face the terminals of the pair of electronic parts, respectively.

The connector may be utilized for connecting an integrated circuit with an electronic circuit for testing the integrated circuit.

According to the fourth aspect of the present invention, there is provided a connector for electrically connecting a pair of electronic parts each having a plurality of terminals, the terminals of the pair of electronic parts correspondingly positioned to each other. The connector comprises: an insulating elastic sheet having a predetermined thickness and first and second surfaces extending parallel relationship with each other and formed with a plurality of through bores each having an axis extending perpendicular relationship to each of the first and second surfaces at positions corresponding to the plurality of terminals of the pair of electronic parts; and a plurality of connecting portions each comprising: an insulating elastic block having a predetermined thickness and first and second surfaces extending parallel relationship with each other and formed with a through bore having an axis extending perpendicular relationship with each of the first and second surfaces; first and second conductive pressing plates respectively disposed on the first and second surfaces of the insulating elastic block to cover the through bore of the insulating elastic block; a lead member positioned in the through bore of the insulating elastic block to have its both ends respectively connected with the first and second conductive pressing plates, the lead member being formed with a bundle of a plurality of fine leads each being fine enough to bend in accordance with the elastic movement of the insulating elastic sheet; and first and second conductive terminals having their one ends connected to the first and second conductive pressing plates, respectively. Each of the plurality of connecting portions is embedded in each of the through bores of the insulating elastic sheet to have the other ends of the first and second conductive pressing plates of each of the connecting portion face the terminals of the pair of electronic parts, respectively.

The connector may be utilized for connecting an integrated circuit with an electronic circuit for testing the integrated circuit.

The bundle of the plurality of fine leads forming the lead member may be twisted.

BRIEF DESCRIPTION OF THE DRAWINGS

The features and advantages of the connector according to the present invention will be more clearly understood from the following description taken in conjunction with the accompanying drawings in which:

FIG. 3 is a fragmental cross-sectional view partly showing a second preferred embodiment of the connector according to the present invention;

FIG. 4 is a fragmental cross-sectional view partly showing the connector shown in FIG. 3 when it is positioned between an integrated circuit and an electronic circuit;

DESCRIPTION OF THE PREFERRED EMBODIMENTS

Figure 1:
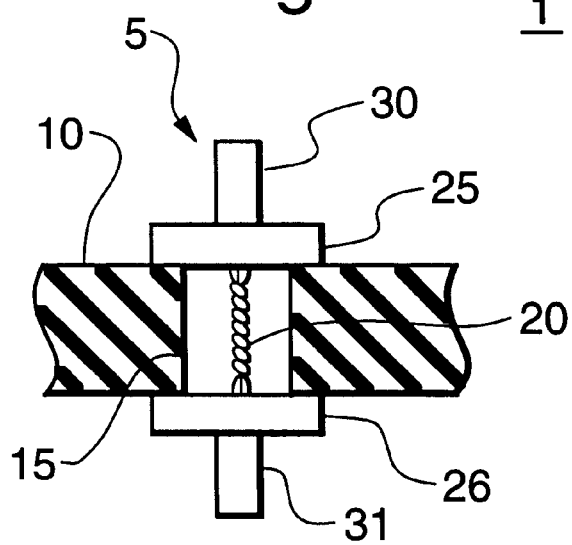
FIG. 1 is a fragmental cross-sectional view partly showing a first preferred embodiment of the connector according to the present invention.
Figure 2:
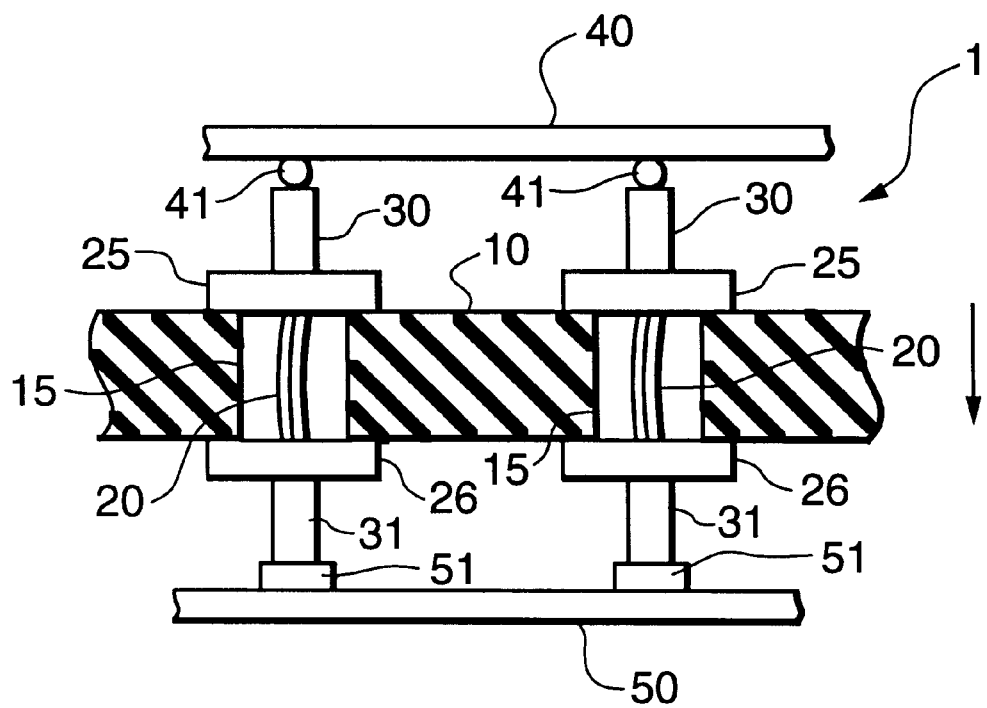
FIG. 2 is a fragmental cross-sectional view partly showing the connector shown in FIG. 1 when it is positioned between an integrated circuit and an electronic circuit.
Figure 5:
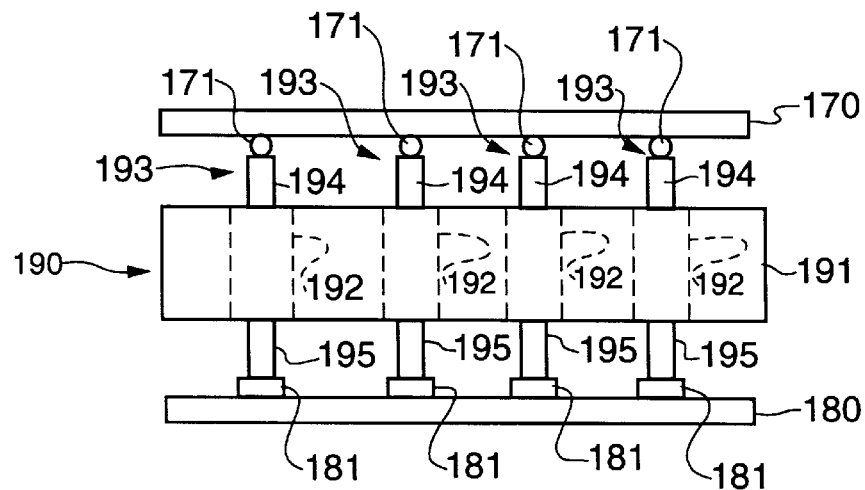
FIG. 5 is a plan view of a conventional IC socket.
Figure 6:
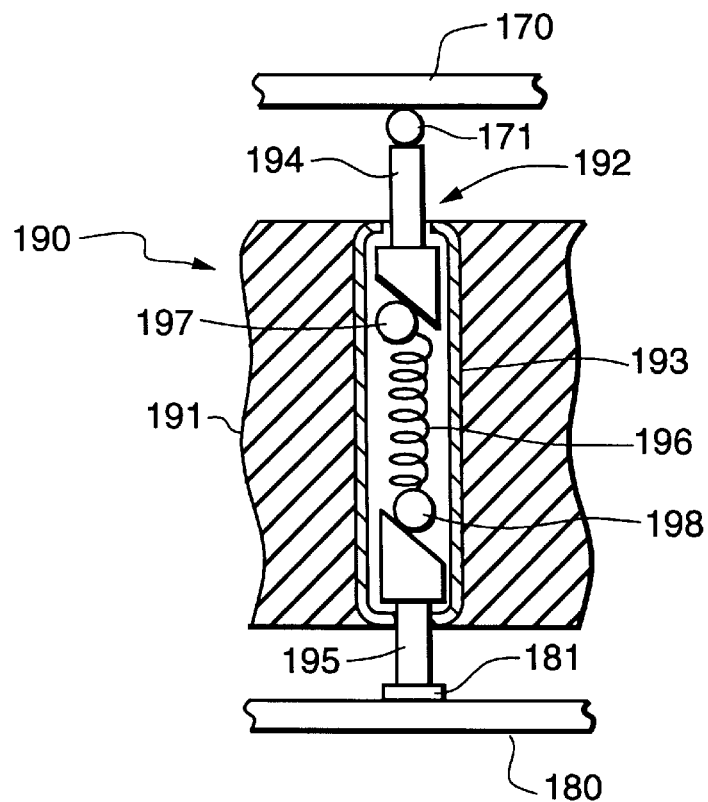
FIG. 6 is an enlarged fragmental cross-sectional view partly showing the conventional IC socket shown in FIG. 5.
Figure 7:
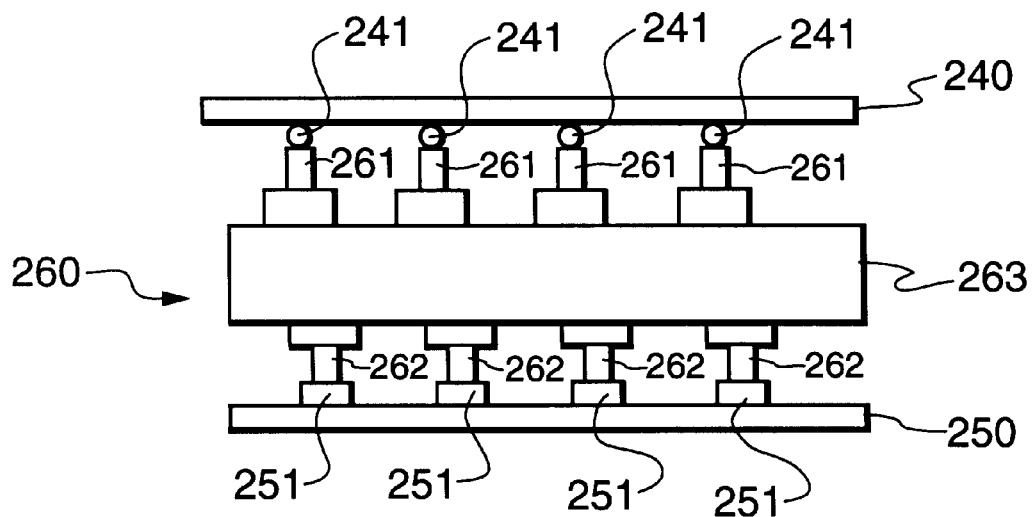
FIG. 7 is a plan view of another conventional IC socket.
Figure 8:
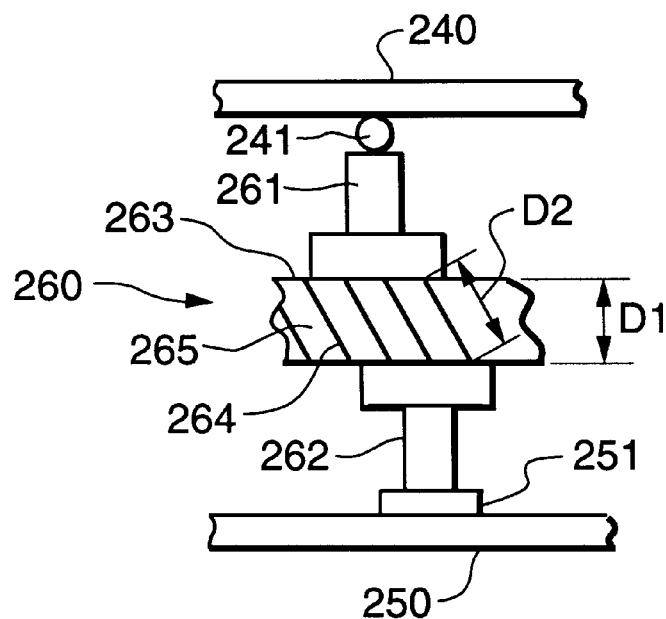
FIG. 8 is an enlarged fragmental cross-sectional view partly showing the another conventional IC socket shown in FIG. 7.

Referring now to FIGS. 1 and 2, there is shown a first preferred embodiment of the connector according to the present invention.

FIG. 1 partly shows the connector 1. It should be understood that the connector 1 comprises an insulating elastic sheet 10 formed with a plurality of through bores 15 and a plurality of conductive portions 5 although FIG. 1 only shows a part of the insulating elastic sheet 10, one of the through bores 15 and one of the conductive portions 5.

The insulating elastic sheet 10 is formed with an elastic material such as a silicon rubber to have a certain thickness and upper and lower surfaces each extending parallel relationship with each other. The through bore 15 has an axis extending perpendicular relationship to the upper and lower surfaces of the insulating elastic sheet 10.

The conductive portion 5 comprises first and second conductive pressing plates 25 and 26, a lead member 20 and first and second conductive terminals 30 and 31.

The lead member 20 is formed with a twisted bundle of a plurality of fine leads such as copper wires and is pressure welded at its both ends by the first and second conductive pressing plates 25 and 26. Here, each of the fine leads is capable of bending against the longitudinal force. The first and second conductive terminals 30 and 31 are respectively connected to the first and second conductive pressing plates 25 and 26. It means that the lead member 20, the first and second conductive pressing plates 25 and 26 and the first and second conductive terminals 30 and 31 are collectively formed into the conductive portion 5.

The conductive portion 5 is inserted into the through bore 15 of the insulating elastic sheet 10 to have the first and second conductive pressing plates 25 and 26 respectively disposed at upper and lower surfaces of the insulating elastic sheet 10. It means that the first and second conductive pressing plates 25 and 26 cover the through bore 15 of the insulating elastic sheet 10 to have the lead member 20 received in the through bore 15 of the insulating elastic sheet 10.

FIG. 2 partly shows an integrated circuit 40 having a plurality of IC terminals 41 and an electronic circuit 50 having a plurality of electronic pads 51 each corresponding to each of the IC terminals 41 of the integrated circuit 40. The through bores 15 of the insulating elastic sheet 10 are formed at positions corresponding to the terminals 41 of the integrated circuit 40 and the electronic pads 51 of the electronic circuit 50 to have the lead members 20 respectively received therein. Therefore, each of the first and second conductive terminals 30 and 31 have their one ends respectively face each of the IC terminals 41 of the integrated circuit 40 and each of the electronic pads 51 of the electronic circuit 50 when the connector 1 is disposed between the integrated circuit 40 and the electronic circuit 50.

In order to electrically connect the integrated circuit 40 with the electronic circuit 50, the connector 1 is disposed between the integrated circuit 40 and the electronic circuit 50 as shown in FIG. 2. Then, the integrated circuit 40 is urged toward the electronic circuit 50 by urging means (not shown in the drawings), to ensure the connections between the integrated circuit 40, the connector 1 and the electronic circuit 50.

The connector 1 can accommodate and withstand the force generated by the urging means which is urging the integrated circuit 40 toward the electronic circuit 50, because of the fact that the insulating elastic sheet 10 is formed with an elastic material and each of the fine leads forming the lead members 20 is capable of bending against the longitudinal force.

The connector 1 can be utilized for testing the electronic performances of a high frequency integrated circuit for the following reasons.

One of the reasons is that the length of each of the lead members 20 through which the electronic current flows is as short as the thickness of the insulating elastic sheet 10. This results in the fact that the electronic performances of the high frequency integrated circuit can be tested with the connector 1 without causing errors.

The other of the reasons is that the connector 1 can have a lot of conductive terminals 30 in a small space, thereby making it possible to conform to a high frequency integrated circuit having a lot of IC terminals in a small space. This results from the fact that the connector 1 can be simply provided with the insulating elastic sheet 10 formed with the plurality of through bores 15 and the plurality of conductive portions 5 respectively received in the through bores 15 of the insulating elastic sheet 10.

Furthermore, the connector 1 hardly becomes useless because of the fact that each of the lead members 20 is formed with a plurality of fine leads, thereby making it possible to have the electronic current flow therethrough even when one of or a part of the fine leads is broken.

Still furthermore, the connector 1 can be easily repaired, even when one of the conductive portions 5 does not work well, by exchanging the damaged conductive portion to a proper one.

Yet furthermore, there may be an additional advantage by using the connector 1 as constructed above. Generally, IC terminals of an integrated circuit formed with solder bumps are easily oxidized with their surfaces to cause insulation of the electronic current between the integrated circuit and a connector. However, each of the conductive portions 5 of the connector 1 can remove the oxidized surfaces of the IC terminals. The reason why each of the conductive portions 5 can remove the oxidized surfaces of the IC terminals will be explained hereinafter.

The bundle of fine leads forming each of the lead members 20 is twisted before the connector 1 is disposed between the integrated circuit 40 and the electronic circuit 50. Each of the fine leads of the lead member 20 is bent to have the twisted bundle of the fine leads forming each of the lead members 20 released when the integrated circuit 40 is urged toward the electronic circuit 50. This results in the fact that each of the conductive portions 5 rotates around the axis of each of the through bores 15 of the insulating sheet 10 to have one end of each of the first terminals 30 frictionally rubbed with the corresponding IC terminal 41 of the integrated circuit 40. Therefore, the oxidized surfaces of the IC terminals 41 are removed and the electronic currents smoothly flow through the integrated circuit 40, the connector 1 and the electronic circuit 50.

Referring now to FIGS. 3 and 4, there is shown a second embodiment of the connector according to the present invention.

FIG. 3 shows a connecting portion 61 comprising an insulating elastic block 70 formed with a through bore 75 and a conductive portion 65. The conductive portion 65 comprises first and second conductive pressing plates 85 and 86, a lead member 80 and first and second conductive terminals 90 and 91.

The insulating elastic block 70 is formed with an elastic material such as a silicon rubber to have a certain thickness and upper and lower surfaces each extending parallel relationship with each other. The through bore 75 of the insulating elastic block 70 has an axis extending perpendicular relationship to the upper and lower surfaces of the insulating elastic block 70.

The lead member 80 is formed with a twisted bundle of a plurality of fine leads such as copper wires and is pressure welded at its both ends by the first and second conductive pressing plates 85 and 86. Each of the fine leads is capable of bending against the longitudinal force. The first and second conductive terminals 90 and 91 are respectively connected to the first and second conductive pressing plates 85 and 86. It means that the lead member 80, the first and second conductive pressing plates 85 and 86 and the first and second conductive terminals 90 and 91 are collectively formed into the conductive portion 65.

The conductive portion 65 is inserted into the through bore 75 of the insulating elastic block 70 to have the first and second conductive pressing plates 85 and 86 respectively disposed at upper and lower surfaces of the insulating elastic block 70. It means that the first and second conductive pressing plates 85 and 86 cover the through bore 75 of the insulating elastic block 70 to have the lead member 80 received in the through bore 75 of the insulating elastic block 70 to form the connecting portion 61.

FIG. 4 shows a part of the connector 101, an integrated circuit 120 having a plurality of IC terminals 121 and an electronic circuit 130 having a plurality of electronic pads 131 each corresponding to each of the IC terminals 121 of the integrated circuit 120.

The connector 101 comprises an insulating elastic sheet 110 formed with a plurality of through bores 115 at positions corresponding to the terminals 121 of the integrated circuit 120 and the electronic pads 131 of the electronic circuit 130 to have the connecting portions 61 respectively received therein. Therefore, each of the first and second conductive terminals 90 and 91 have their one ends respectively face each of the IC terminals 121 of the integrated circuit 120 and each of the electronic pads 131 of the electronic circuit 130 when the connector 101 is disposed between the integrated circuit 120 and the electronic circuit 130.

In order to electrically connect the integrated circuit 120 with the electronic circuit 130, the connector 101 is disposed between the integrated circuit 120 and the electronic circuit 130 as shown in FIG. 4. Then, the integrated circuit 120 is urged toward the electronic circuit 130 by urging means (not shown in the drawings), to ensure the connections between the integrated circuit 120, the connector 101 and the electronic circuit 130.

The connector 101 can accommodate and withstand the force generated by the urging means which is urging the integrated circuit 120 toward the electronic circuit 130, because of the fact that each of the fine leads forming the lead members 80 is capable of bending against the longitudinal force.

The connector 101 can be utilized for testing the electronic performances of a high frequency integrated circuit for the following reasons.

One of the reasons is that the length of each of the lead members 80 through which the electronic current flows is as short as the thickness of the insulating elastic block 70. This results in the fact that the electronic performances of the high frequency integrated circuit can be tested with the connector 101 without causing errors.

The other of the reasons is that the connector 101 can have a lot of conductive terminals in a small space, thereby making it possible to conform to a high frequency integrated circuit having a lot of IC terminals in a small space. This results from the fact that the connector 101 can be simply provided with the insulating elastic sheet 110 formed with a plurality of through bores 115 and the plurality of the connecting portions 61 to be respectively received in the through bores 115 of the insulating elastic sheet 110.

Furthermore, the connector 101 hardly becomes useless because of the fact that each of the lead members 80 is formed with a plurality of fine leads, thereby making it possible to have the electronic current flow therethrough even when one of or a part of the fine leads is broken.

Furthermore, the connector 101 can be easily repaired, even when one of the connecting portions 61 does not work well, by exchanging the damaged connecting portion with a proper one.

While the present invention has thus been shown and described with reference to the specific embodiment, however, it should be noted that the invention is not limited to the illustrated structures but changes and modifications may be made without departing from the scope of the appended claims.

What is claimed is:

1. A connector for electrically connecting a pair of electronic parts each having a terminal, said terminals of said pair of electronic parts correspondingly positioned to each other, comprising:

an insulating elastic sheet having a predetermined thickness and first and second surfaces extending parallel relationship with each other and formed with a through bore having an axis extending perpendicular relationship to each of said first and second surfaces at a position corresponding to said terminals of said pair of electronic parts;

first and second conductive pressing plates respectively disposed on said first and second surfaces of the insulating elastic sheet to cover said through bore of said insulating elastic sheet;

a lead member positioned in said through bore of said insulating elastic sheet to have its both ends respectively connected with said first and second conductive pressing plates; and first and second conductive terminals having their one ends connected to said first and second conductive pressing plates to have their other ends face to the terminals of said pair of electronic parts, respectively, in which said lead member is formed with a fine lead fine enough to bend in accordance with the elastic movement of said insulating elastic sheet.

2. The connector as set forth in claim 1 being utilized for connecting an integrated circuit with an electronic circuit for testing said integrated circuit.

3. A connector for electrically connecting a pair of electronic parts each having a terminal, said terminals of said pair of electronic parts correspondingly positioned to each other, comprising:

an insulating elastic sheet having a predetermined thickness and first and second surfaces extending parallel relationship with each other and formed with a through bore having an axis extending perpendicular relationship to each of said first and second surfaces at a position corresponding to said terminals of said pair of electronic parts;

first and second conductive pressing plates respectively disposed on said first and second surfaces of the insulating elastic sheet to cover said through bore of said insulating elastic sheet;

a lead member positioned in said through bore of said insulating elastic sheet to have its both ends respectively connected with said first and second conductive pressing plates; and first and second conductive terminals having their one ends connected to said first and second conductive pressing plates to have their other ends face to the terminals of said pair of electronic parts, respectively, in which said lead member is formed with a bundle of a plurality of fine leads each being fine enough to bend in accordance with the elastic movement of said insulating elastic sheet.

4. The connector as set forth in claim 3 being utilized for connecting an integrated circuit with an electronic circuit for testing said integrated circuit.

5. The connector as set forth in claim 3, in which said bundle of said plurality of fine leads forming said lead member is twisted.

6. A connector for electrically connecting a pair of electronic parts each having a plurality of terminals, said terminals of said pair of electronic parts correspondingly positioned to each other, comprising:

an insulating elastic sheet having a predetermined thickness and first and second surfaces extending parallel relationship with each other and formed with a plurality of through bores each having an axis extending perpendicular relationship to each of said first and second surfaces at positions corresponding to said plurality of terminals of said pair of electronic parts; and a plurality of connecting portions each comprising:

an insulating elastic block having a predetermined thickness and first and second surfaces extending parallel relationship with each other and formed with a through bore having an axis extending perpendicular relationship with each of said first and second surfaces;

first and second conductive pressing plates respectively disposed on said first and second surfaces of said insulating elastic block to cover said through bore of said insulating elastic block;

a lead member positioned in said through bore of said insulating elastic block to have its both ends respectively connected with said first and second conductive pressing plates, said lead member being formed with a fine lead fine enough to bend in accordance with the elastic movement of said insulating elastic sheet; and first and second conductive terminals having their one ends connected to said first and second conductive pressing plates, respectively;

in which each of said plurality of connecting portions is embedded in each of said through bores of said insulating elastic sheet to have the other ends of said first and second conductive pressing plates of each of said connecting portion face said terminals of said pair of electronic parts, respectively.

7. The connector as set forth in claim 6 being utilized for connecting an integrated circuit with an electronic circuit for testing said integrated circuit.

8. A connector for electrically connecting a pair of electronic parts each having a plurality of terminals, said terminals of said pair of electronic parts correspondingly positioned to each other, comprising:

an insulating elastic sheet having a predetermined thickness and first and second surfaces extending parallel relationship with each other and formed with a plurality of through bores each having an axis extending perpendicular relationship to each of said first and second surfaces at positions corresponding to said plurality of terminals of said pair of electronic parts; and a plurality of connecting portions each comprising:

an insulating elastic block having a predetermined thickness and first and second surfaces extending parallel relationship with each other and formed with a through bore having an axis extending perpendicular relationship with each of said first and second surfaces;

first and second conductive pressing plates respectively disposed on said first and second surfaces of said insulating elastic block to cover said through bore of said insulating elastic block;

a lead member positioned in said through bore of said insulating elastic block to have its both ends respectively connected with said first and second conductive pressing plates, said lead member being formed with a bundle of a plurality of fine leads each being fine enough to bend in accordance with the elastic movement of said insulating elastic sheet; and first and second conductive terminals having their one ends connected to said first and second conductive pressing plates, respectively;

in which each of said plurality of connecting portions is embedded in each of said through bores of said insulating elastic sheet to have the other ends of said first and second conductive pressing plates of each of said connecting portion face said terminals of said pair of electronic parts, respectively.

9. The connector as set forth in claim 8 being utilized for connecting an integrated circuit with an electronic circuit for testing said integrated circuit.

10. The connector as set forth in claim 8, in which said bundle of said plurality of fine leads forming said lead member is twisted.

\* \* \* \* \*